United States Patent
Weisfield

(10) Patent No.: US 7,426,259 B2
(45) Date of Patent: Sep. 16, 2008

(54) IMAGING SYSTEM AND METHOD THAT REMOVES AN ELECTRICAL CHARGE FROM A SENSOR

(75) Inventor: Richard L. Weisfield, Mountain View, CA (US)

(73) Assignee: Xerox Corporation, Norwalk, CT (US)

( * ) Notice: Subject to any disclaimer, the term of this patent is extended or adjusted under 35 U.S.C. 154(b) by 505 days.

(21) Appl. No.: 10/929,408

(22) Filed: Aug. 31, 2004

(65) Prior Publication Data

US 2006/0045239 A1 Mar. 2, 2006

(51) Int. Cl.
*H01L 25/00* (2006.01)
(52) U.S. Cl. ............... 378/98.8; 250/370.09
(58) Field of Classification Search ........... 378/98.8, 378/98.4, 207, 62, 98.3; 250/370.08, 370.09, 250/370.11; 362/30

See application file for complete search history.

(56) References Cited

U.S. PATENT DOCUMENTS 5,563,421 A * 10/1996 Lee et al. ............. 250/580
5,905,772 A * 5/1999 Rutten et al. ........... 378/98.8
6,648,485 B1 * 11/2003 Colgan et al. ............ 362/600

* cited by examiner

*Primary Examiner*—Hoon Song
(74) *Attorney, Agent, or Firm*—Oliff & Berridge, PLC

(57) ABSTRACT

An imaging system that removes an electrical charge from a sensor. The system includes a generator that generates x-rays, a sensor that stores an electrical charge, a plate positioned above the sensor and a light source. A controller determines whether the electrical charge should be removed from the sensor. If it is determined that the electrical charge should be removed, the controller controls the light source to illuminate the plate to distribute the light on a top surface of the sensor. A method includes arranging a plate above the sensor and a light source next to the plate, generating x-rays towards the sensor, and storing an electrical charge in the sensor. If it is determined that the electrical charge should be removed, the light source is controlled to illuminate the plate so that the light from the light source is distributed on a top surface of the sensor.

17 Claims, 5 Drawing Sheets

IMAGING SYSTEM AND METHOD THAT REMOVES AN ELECTRICAL CHARGE FROM A SENSOR

BACKGROUND OF THE INVENTION

1. Field of Invention

The invention relates to imaging systems and methods. More specifically, the invention relates to imaging systems and methods that discharge an electrical charge stored in an image sensor.

2. Description of Related Art

Selenium-based X-ray imaging devices are commonly used in imaging systems to directly convert X-rays into an electrical charge. The electrical charge may be read out using conventional TFT switches and charge-sensitive amplifiers. Selenium has a high resistance value which provides a benefit in using selenium based X-ray imaging devices. Moreover, because the electrical charge does not spread laterally, an image with a high resolution may be obtained. These benefits make selenium-based imaging devices ideal, for example, in mammogram applications where the resolution of approximately 50 microns is desirable.

However, a disadvantage in using selenium is its propensity to trap or retain an electrical charge for a longer duration that desired, and in some instances, it requires many seconds to remove the electrical charge. The trapped electrical charges may disturb subsequent cycles of image formation. Thus, the trapped electrical charges need to be removed quickly. The trapped electrical charges are exacerbated in configurations where insulating layers are located between the selenium and its electrical contacts. The insulating layers are used to block electrical charge injection from the electrical contacts and to reduce dark current. However, this configuration also tends to prevent any electrical charge flow into the selenium that may neutralize the trapped electrical charges in the sensors.

One conventional device that removes the trapped electrical charges uses a back-illumination of a selenium array. This device uses a transparent glass substrate underneath the selenium array. However, the device requires a transparent pixel structure so that the back-illuminated light may pass through the pixel structure to the selenium. The problem with this arrangement is that the pixel structure needs to include a very large storage capacitor (nearly the entire length area of the pixel) to remove the electrical signals trapped in the selenium. The storage capacitors are conventionally formed between gate and data metal electrodes using the gate insulating layer as the capacitor dielectric. If the pixel is transparent, then both the bottom and top metals of the storage capacitor need to be formed of transparent material, for example, indium tin oxide (ITO). This configuration requires additional steps for forming the storage capacitors and results in a more costly device.

SUMMARY OF THE INVENTION

Based on the problems discussed above, the invention is an imaging system that removes an electrical charge from a sensor. The system may include a generator that generates x-rays, a sensor that stores an electrical charge, a plate positioned above the sensor and a light source. A controller determines whether the electrical charge should be removed from the sensor. If it is determined that the electrical charge should be removed, the controller controls the light source to illuminate the plate to distribute the light on a top surface of the sensor. This configuration does not prevent electrical charge flow from entering into the selenium to neutralize the trapped electrical charges in the sensors.

A method may include arranging a plate above the sensor and a light source next to the plate, generating x-rays towards the sensor, and storing an electrical charge in the sensor. If it is determined that the electrical charge should be removed, the light source is controlled to illuminate the plate so that the light from the light source is distributed on a top surface of the sensor. Because this method does not require additional steps to form storage capacitors, the overall cost of the system is reduced.

Furthermore, because the trapped electrical charges within the sensor array may be removed quickly, subsequent cycles of image formation are not disturbed.

In various alternative embodiments of the invention, the plate may be composed of glass or plastic. The plate may also include a pattern of grooves or reflective zones. The plate may be formed at a thickness that does not defocus or absorb the x-rays passing through the plate. Moreover, the plate may be a tapered piece of light pipe formed on top of the layer of x-ray sensitive material.

In various alternative embodiments of the invention, the light source may be positioned on an edge of the plate so that the light reflects within the plate and is evenly distributed on the top surface of the sensor. Furthermore, a controller may include a light source circuit that controls the illumination of light from the light source and a measuring circuit that measures an amount of electrical charge stored in the sensor after a predetermined duration of time has expired.

BRIEF DESCRIPTION OF THE DRAWINGS

Various exemplary embodiments of the systems and methods according to the invention will be described in detail, with reference to the following figures, wherein.

DETAILED DESCRIPTION OF PREFERRED EMBODIMENTS

The invention relates to imaging systems and sensors and to systems and methods that remove an electrical charge stored in an imaging sensor. For reasons of convenience, the examples below will be discussed using an X-ray imaging system. However, it should be appreciated by one skilled in the art that the systems and methods of the invention may be used with any known imaging system without departing from the spirit and scope of the invention.

Figure 1:
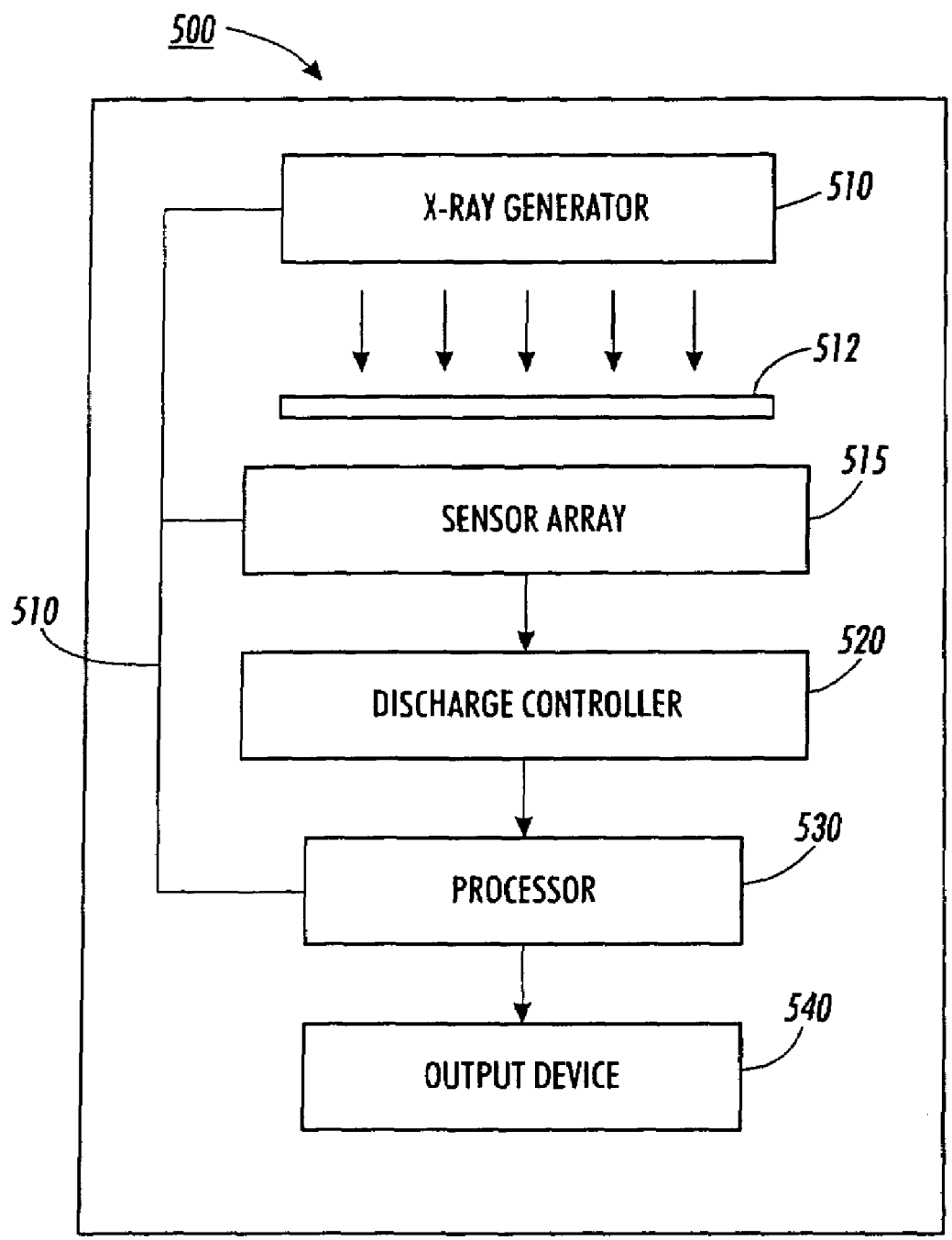
FIG. 1 is an exemplary diagram showing an imaging system in accordance with the invention.

FIG. 1 is an exemplary diagram showing an imaging system 500 in accordance with the invention. As shown in FIG. 1, the imaging system 500 includes an X-ray generator 510, sensor array 515, discharge controller 520, processor 530 and output device 540 which may all be connected via links 550. The X-ray generator 510 may be any device that is controlled by the processor 530 to generate X-rays towards the sensor array 515 to obtain an image of an object 512. The sensor array 515 may include several layers of material that form the cell circuitry. The sensor array 515 may be any device that detects the X-rays and converts them into electrical signals that are used to form the image of the object 512. The electrical signals may be stored in the cell circuitry. The discharge controller 520 may detect the electrical charge stored in the cell circuitry of the sensor array 515, measure a duration of how long the electrical charge has been stored in the sensor array 515 and control the sensor array 515 to discharge the electrical charge. The sensor array 515 may be controlled by the processor 530 to convert the electrical signals into the image of the object 512 after the object 512 has been positioned, for example, in between the X-ray generator 510 and the sensor array 515. The processor 530 may then control the stored electrical signals to be outputted to the output device 540. The processor 530 may be any known device used in processing images. For example, the processor 530 may processes analog or digital signals to form the image. The output device 540 may be, for example, a printer, a display monitor or any other known device used to record or display data.

Figure 2:
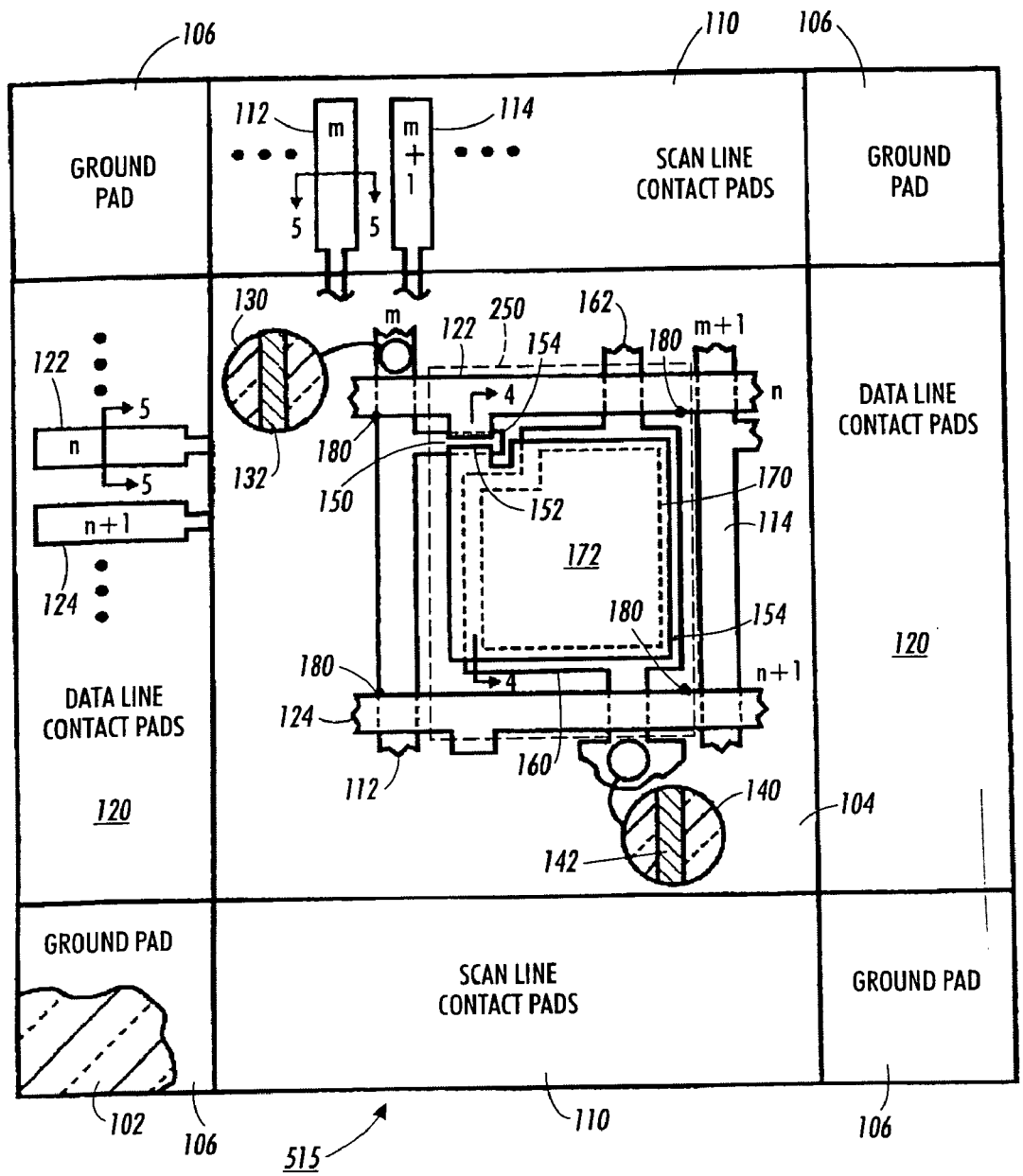
FIG. 2 is an exemplary detailed diagram showing a sensor array that may be used in the imaging system in accordance with the invention.

FIG. 2 is an exemplary detailed diagram showing a sensor array 515 that may be used in an imaging system in accordance with the systems and methods of the invention. As shown in FIG. 2, the sensor array 515 may include a substrate 102 with an array circuitry 104 and several kinds of peripheral circuitry, including ground pads 106, one at each corner of the substrate 102. The peripheral circuitry may also include scan line contact pads 110 at the upper and lower sides of array circuitry 104. The contact pads shown in FIG. 2 show mth scan line 112 and (m+1)th scan line 114 for exemplary reasons only. The peripheral circuitry may also include data line contact pads 120 at the left and right sides of array circuitry 104. FIG. 2 shows the contact pads for nth data line 122 and (n+1)th data line 124 for exemplary reasons only. The array circuitry 104 may include amorphous silicon TFTs or other types of switching elements with channels formed of other material.

A cutaway 130 shows an aluminum shunt 132 under the scan line 112 which may provide a highly conductive path for scan signals across array circuitry 104. Another cutaway 140 similarly shows an aluminum shunt 142 which may provide a highly conductive connection for the lower electrode of the capacitor of each unit of cell circuitry to ground pads 106, which may be held at a constant ground voltage during operation. The contact leads 150 and 152 may be formed in the same conductive layer as the data lines 122 and 124, which may similarly include aluminum to provide highly conductive connections and signal paths. As shown in FIG. 2, the contact leads 150 and 152 may each overlap the gate lead 154, which may join the scan line 112 so that a thin film transistor is formed in semiconductor layers between the contact leads 150 and 152 and gate 154.

The contact lead 150 may join the data line 122, while the contact lead 152 may join the upper electrode 156 which may cover the lower electrode 160. The lower electrode 160 may join the capacitive line 162 which may include the aluminum shunt 142 so that the lower electrode 160 may be held at ground. As shown in FIG. 2, the electrodes 156 and 160 may be slightly offset from each other to ensure that a capacitor area (if required) will not decrease significantly despite a slight left-right or up-down alignment errors that may occur. The dashed line 170 shows a boundary around an exposed area 172 of the electrode 156. A passivating layer over the electrode 156 may have an opening within the dashed line 170. The dashed line 170 may be parallel to the boundary of the electrode 156, and adequately spaced from the boundary. A plate 250 may be positioned within the array circuitry 104 and used to discharge the electrical signals stored in the array circuitry 104 as discussed below in more detail.

The boundary around the area of the upper conductive element is shown in FIG. 2 by dots 180, each marking a corner of the conductive element. The conductive element may contact the electrode 156 in the entirety of the exposed area 172 and may be therefore electrically connected to the contact lead 152 through the electrode 156. The size of the exposed area 172 may vary, but a larger area may be preferred because it may allow a more robust contact between the electrode 156 and the conductive element. It may be desirable to make the exposed area 172 as large as possible. The conductive element of each unit of cell circuitry may overlap the scan line 112, align with but not overlap the data lines 122 and 124, and may be spaced from scan line 114. This arrangement may avoid introducing noise from the scan line 114 and data lines 122 and 124 while allowing maximization of the area of the conductive element. The area of the conductive element may be maximized by reducing the spacing between the conductive elements of the adjacent units to a spacing just sufficient to maintain isolation.

Figure 3:
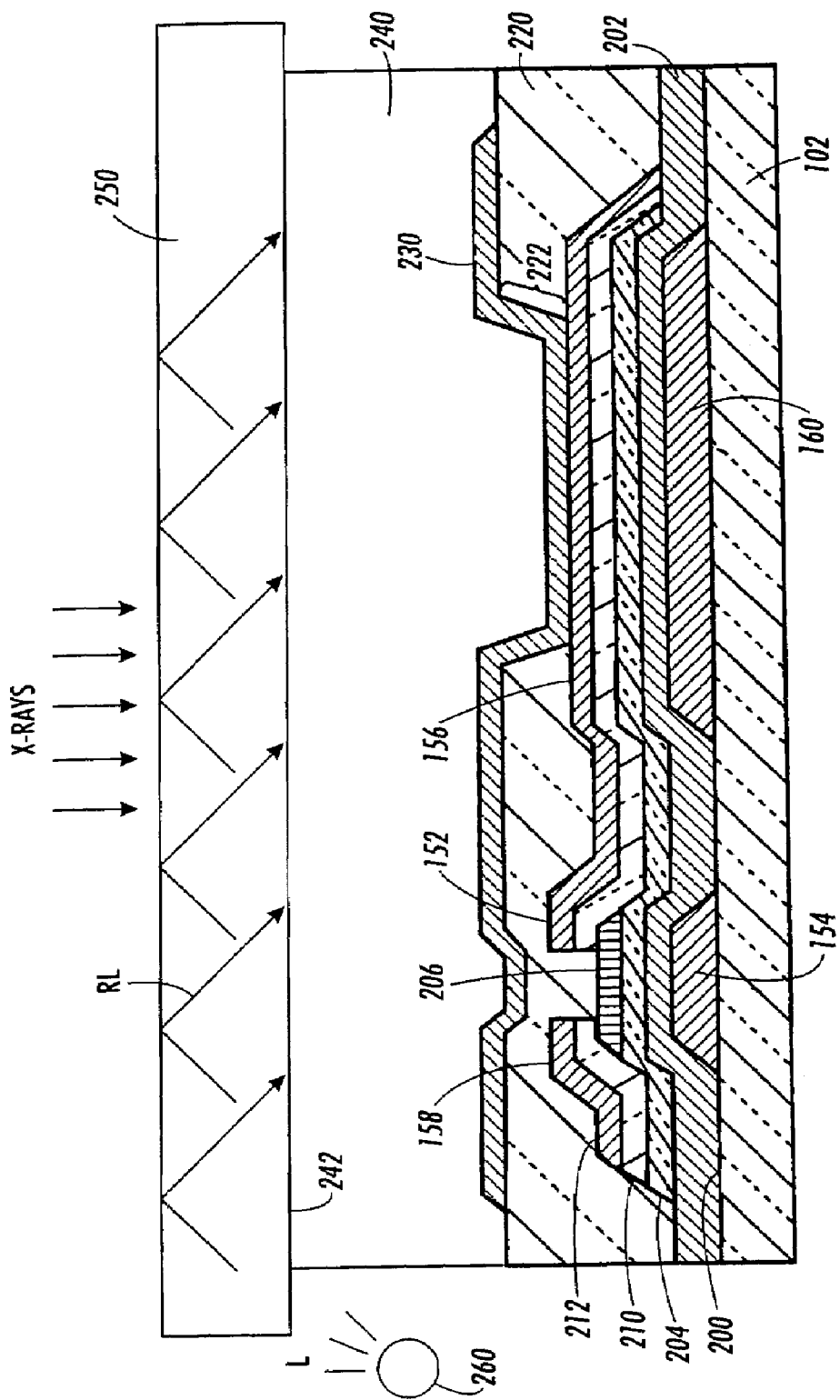
FIG. 3 is an exemplary diagram showing a cross-sectional view of the array shown in FIG. 1.

FIG. 3 is an exemplary diagram showing a cross-sectional view of FIG. 2 along line 4-4 and layers at a surface 200 of substrate 102. A first conductive layer, a layer of titanium tungsten in the current implementation, may include a gate lead 154 and lower electrode 160. In the illustrated cross section, this conductive layer may not include an aluminum shunt layer as illustrated in the cutaways 130 and 140 in FIG. 2.

The insulating layer 202, which may be a bottom layer of silicon nitride, may cover the gate lead 154 and lower electrode 160 as well as other features formed in the same conductive layer, including scan lines and capacitor lines. A semiconductive layer 204 may be formed above the insulating layer 202. This layer may be a layer of intrinsic amorphous silicon (a-Si) in which the TFT channel may be formed. An insulating layer 206 may be formed above the semiconductive layer 204. This layer may be a top layer of silicon nitride that forms an island over the channel in layer 204 and also forms an island (not shown) over the crossover region of each scan line in which a data line crosses over the scan line. A doped semiconductive layer 210 may be formed above the layers 204 and 206 which may be a layer of heavily n-doped a-Si that provides conductive channel leads at each end of the channel in layer 204. As shown in FIG. 3, the layers 204 and 210 may both extend over the electrode 160.

The conductive layer 212 may be formed over layer 210 which may include a highly conductive metal such as aluminum. In this example, the layer 212 may include a lower sublayer of titanium tungsten, a middle sublayer of aluminum, and an upper sublayer of titanium tungsten. The contact leads 150 and 152 and upper electrode 156 may all be formed in the layer 212, together with data lines as shown in FIG. 2. An insulating layer 220 may be formed over layer 212 which may be a layer of silicon oxynitride that acts as a passivation layer. The layer 220 may have an opening formed in it to expose an area of upper electrode 156, and edge 222 around the opening has a tapered profile as shown.

The conductive element 230 may be formed in a conductive layer, contacting the exposed part of upper electrode 156. The conductive element 230 may be currently implemented as a layer of indium tin oxide (ITO). The conductive element 230 may extend above the contact leads 150 and 152 and the channel in the layer 204, and may also overlap its scan line as shown in FIG. 2. The insulating layer 220 may be sufficiently thick to prevent the conductive element 230 from significantly slowing propagation of signals on the scan line it overlaps. The size of the opening in insulating layer 220 may also be adjusted to provide more space for tapering to ensure that conductive element 230 does not crack at edge 222. The electrical charge stored in the sensor array 515 may be read out using conventional TFT switches and charge-sensitive amplifiers.

As shown in FIG. 3, a layer of X-ray sensitive material 240 may be formed above the conductive element 230 so that each conductive element 230 receives a quantity of charge carriers from a region of the material indicating intensity of X-ray radiation received by the region. The X-ray sensitive material 240 may be selenium or any other material sensitive to X-rays. In accordance with the exemplary embodiments of the imaging system 500 of the invention, the system may also include a light source 260 and a plate 250. The light source 260 may illuminate the top surface 242 of the layer of the X-ray sensitive material 240 by using the plate 250. The plate 250 may be formed of a material that evenly distributes the light RL from the light source 260 across the top surface 242 of the layer of X-ray sensitive material 240. For example, the plate 250 may be formed of plastic, glass or any other material that allows the light from the light source 260 to be distributed across the top surface 242. The plate 250 may be a edge-lit plate similar to the device used in laptop computers as a backlight. Furthermore, the plate 250 may include a pattern of grooves or reflective zones, may be a tapered piece of light pipe or may be any known material and shape that causes the light from the light source 260 to illuminate top surface 242 of the layer of X-ray sensitive material 240 without departing from the spirit and scope of the invention. The thickness of the plate 250 should be formed so that the plate 250 will not defocus or absorb the X-rays passing through the plate 250 to the array of sensors.

As shown in FIG. 3, the light from the illumination device 260 impinges on the top surface 242 of the layer of X-ray sensitive material 240 to neutralize an electrical charge stored on the layer of X-ray sensitive material 240 once the X-ray generator 510 has generated X-rays that radiate the X-ray sensitive material 240. This configuration is an improvement to the back-illuminated approach previous discussed where each pixel contains light blocking regions which light cannot sufficiently diffuse to neutralize all the trapped electrical charge. No additional storage capacitors are required with this configuration because conventional sensor arrays may be used with the systems of the invention.

Figure 4:
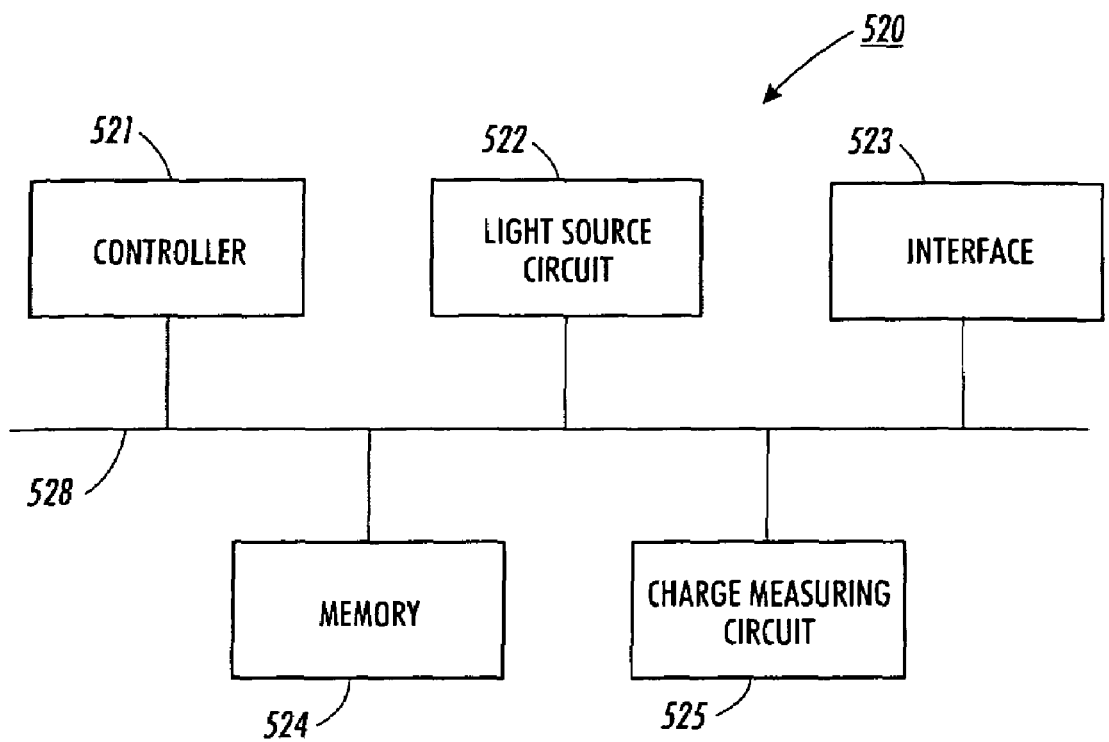
FIG. 4 is an exemplary detailed diagram of the discharge controller shown in FIG. 1.

FIG. 4 is an exemplary detailed diagram of the discharge controller shown in FIG. 1. As shown in FIG. 4, the discharge controller 520 may include a controller 521, a light source circuit or routine 522, an interface 523, a memory 524 and a charge measuring circuit or routine 525. The discharge controller 520 may include more or less elements without departing from the spirit and scope of the invention. The elements 521-525 may be connected through a bus 528 and controlled to communicated with each other using the interface 523.

In the illustrated embodiment, the controller 521 is implemented with general purpose processors. However, it will be appreciated by those skilled in the art that the controller 521 may be implemented using a single special purpose integrated circuit (e.g., ASIC) having a main or central processor section for overall, system-level control, and separate sections dedicated to performing various different specific computations, functions and other processes under control of the central processor section. The controller 521 may be a plurality of separate dedicated or programmable integrated or other electronic circuits or devices (e.g., hardwired electronic or logic circuits such as discrete element circuits, or programmable logic devices such as PLDs, PLAs, PALs or the like). The controller 521 may be suitably programmed for use with a general purpose computer, e.g., a microprocessor, micro-controller or other processor device (CPU or MPU), either alone or in conjunction with one or more peripheral (e.g., integrated circuit) data and signal processing devices. In general, any device or assembly of devices on which a finite state machine capable of implementing the procedures described herein may be used as the controller 521. A distributed processing architecture may be used for maximum data/signal processing capability and speed.

The controller 521 controls the light source circuit or routine 522 to illuminate the light source 260 as discussed about. The memory 524 may be any storage device (which may include large databases shared in a variety of memory types such as disks, tapes, RAM, etc.). The charge measuring circuit or routine 525 is controlled by the controller 521 to detect and measure an electrical charge stored in the layer of X-ray sensitive material 240 and discharge the electrical charge when the controller determines that the layer of X-ray sensitive material 240 should no longer be charged. For example, a predetermined value may be stored in the memory 524 that defines a predetermined time duration that the electrical charge should be stored in the layer of X-ray sensitive material 240. Once the charge measuring circuit or routine 525 determines that the predetermined time duration has expired, the controller 521 controls the charge measuring circuit or routine 525 to discharge the electrical charge from the layer of X-ray sensitive material 240.

Figure 5:
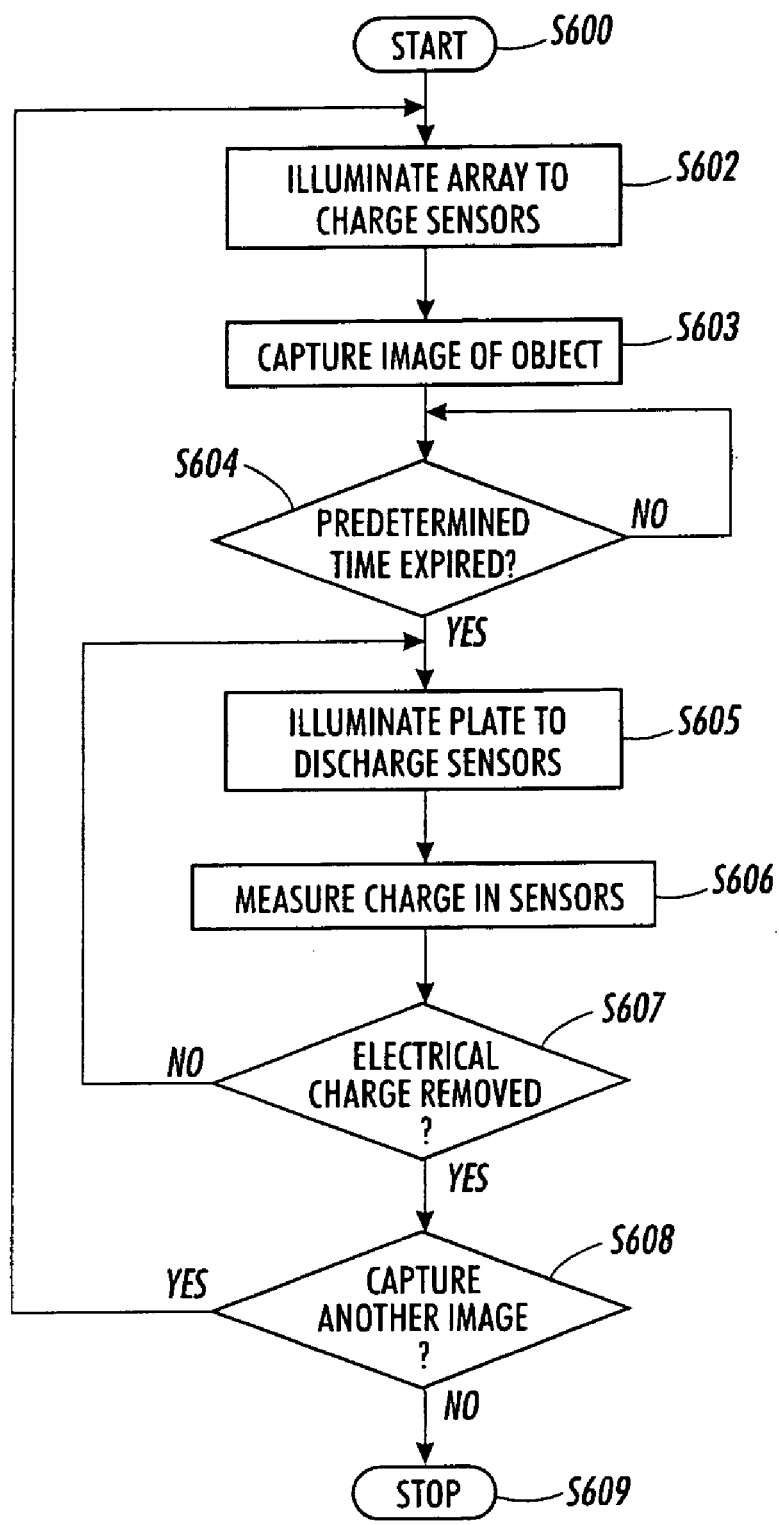
FIG. 5 is an exemplary flowchart showing a method of discharging the sensors in accordance with the systems and methods of the invention.

FIG. 5 is an exemplary flowchart showing a method of discharging the sensors in accordance with the systems and methods of the invention. After control begins in S600, control shifts to S602 where the array of sensors and an object are illuminated by the X-rays to charge the array of sensors. Next, in S603, control captures an image of the object and stores the image in the memory. Control then shifts to S604 where it is determined whether a predetermined time has expired. If it is determined in S604 that a predetermined time has not expired, then control returns to S604. When it is determined in S604 that the predetermined time has expired, then control shifts to S605 where the plate is illuminated to discharge the electrical charge from the sensor array. Then control shifts to S606.

In S606, control measures the electrical charge in the sensor array. Then, in S607 it is determined whether the electrical charge has been removed from the sensor array. If it is determined in S607 that the electrical charge has not been removed from the sensor array, then control shifts back to S605 and the plate is once again illuminated to discharge the electrical charge from the sensor array. Then control measures the electrical charge in the sensor array once again in S607. If it is determined in S607 that the electrical charge has been removed from the sensor array, then control shifts to S608 where is it determined whether another image should be captured. If it is determined in S608 that another image will be captured, then control shifts to S602 and the routine starts over. If it is determined in S608 that another image will not be captured, the control shifts to S609 where the control stops.

While the invention has been described in conjunction with exemplary embodiment, these embodiments should be viewed as illustrative, not limiting. Various modifications, substitutes, or the like are possible within the spirit and scope of the invention.

What is claimed is:

1. An imaging system that removes an electrical charge from a sensor, comprising:
   a generator that generates x-rays;
   a sensor that stores an electrical charge created by the generated x-rays;
   a reflective plate that is positioned above the sensor;

a light source, wherein the light source is detached from the sensor and the reflective plate and is between the plane corresponding to the lower surface of the reflective plate and the plane corresponding to the lower surface of the sensor; and a controller that determines whether the electrical charge should be removed from the sensor, and when it is determined that the electrical charge should be removed from the sensor, the controller controls the light source to illuminate the reflective plate so that the light from the light source is distributed on a top surface of the sensor wherein, the sensor is an array of sensors that includes a layer of x-ray sensitive material, and the reflective plate is positioned to be in contact with the surface of the x-ray sensitive material.

2. The imaging system of claim 1, further comprising an object positioned in between the generator and the sensor so that an image is captured when the electrical charge is stored in the sensor.

3. The imaging system of claim 1, further comprising the layer of x-ray sensitive material being selenium.

4. The imaging system of claim 1, further comprising the reflective plate being composed of one of at least glass and plastic.

5. The imaging system of claim 4, further comprising the light source being positioned near an edge of the reflective plate so that the light reflects within the reflective plate and is evenly distributed on the top surface of the sensor.

6. The imaging system of claim 4, further comprising the reflective plate including one of at least a pattern of grooves and reflective zones.

7. The imaging system of claim 4, further comprising the reflective plate being formed at a thickness that does not defocus or absorb the x-rays passing through the reflective plate.

8. The imaging system of claim 1, further comprising the reflective plate being a tapered piece of light pipe.

9. The imaging system of claim 1, further comprising the controller including a light source circuit that controls the illumination of light from the light source and a measuring circuit that measures an amount of electrical charge stored in the sensor after a predetermined duration of time has expired.

10. A method of removing an electrical charge from a sensor in an imaging system, comprising:

arranging a reflective plate directly above the sensor;

arranging a light source detached from the sensor and the reflective plate;

generating x-rays towards the sensor;

storing an electrical charge in the sensor, the electrical charge created by the generated x-rays;

determining whether the electrical charge should be removed from the sensor, and when it is determined that the electrical charge should be removed from the sensor, controlling the light source to illuminate the reflective plate so that the light from the light source is distributed on a top surface of the sensor; and positioning the light source between the plane corresponding to the lower surface of the reflective plate and the plane corresponding to the lower surface of the sensor so that the light reflects within the reflective plate and is evenly distributed on the top surface of the sensor wherein, the sensor is an array of sensors that includes a layer of x-ray sensitive material, and the reflective plate is positioned to be in contact with the top surface of the x-ray sensitive material.

11. The method of removing an electrical charge of claim 10, further comprising positioning an object in between a source of the generated x-rays and the sensor so that an image is captured when the electrical charge is stored in the sensor.

12. The method of removing an electrical charge of claim 10, further comprising forming the layer of x-ray sensitive material of selenium.

13. The method of removing an electrical charge of claim 10, further comprising forming the reflective plate of one of at least glass and plastic.

14. The method of removing an electrical charge of claim 10, further comprising forming the reflective plate to include one of at least a pattern of grooves and reflective zones.

15. The method of removing an electrical charge of claim 13, further comprising forming the reflective plate at a thickness that does not defocus or absorb the x-rays passing through the reflective plate.

16. The method of removing an electrical charge of claim 10, further comprising forming the reflective plate to be a tapered piece of light pipe.

17. The method of removing an electrical charge of claim 10, further comprising controlling a light source circuit to illuminate the light from the light source and a measuring circuit to measure an amount of electrical charge stored in the sensor after a predetermined duration of time has expired.

* * * * *